(12) United States Patent
Wang

(10) Patent No.: US 7,579,850 B2
(45) Date of Patent: Aug. 25, 2009

(54) PROBE CARD AND METHOD FOR ASSEMBLING THE SAME

(75) Inventor: Cheng-Yi Wang, Taipei (TW)

(73) Assignee: Allstron Inc., Taipei (TW)

( * ) Notice: Subject to any disclaimer, the term of this patent is extended or adjusted under 35 U.S.C. 154(b) by 28 days.

(21) Appl. No.: 11/892,431

(22) Filed: Aug. 23, 2007

(65) Prior Publication Data
US 2009/0051377 A1    Feb. 26, 2009

(51) Int. Cl.
*G01R 31/02* (2006.01)
(52) U.S. Cl. .......................... 324/754; 324/762
(58) Field of Classification Search ........................ None
See application file for complete search history.

(56) References Cited
U.S. PATENT DOCUMENTS 5,124,639 A * 6/1992 Carlin et al. ................. 324/760
5,134,365 A * 7/1992 Okubo et al. ................ 324/754
5,382,898 A * 1/1995 Subramanian ............... 324/754
5,841,291 A * 11/1998 Liu et al. ..................... 324/755
5,923,178 A * 7/1999 Higgins et al. .............. 324/754

\* cited by examiner

*Primary Examiner*—Minh N Tang
(74) *Attorney, Agent, or Firm*—Muncy, Geissler, Olds & Lowe, PLLC

(57) ABSTRACT

A probe card and a method for assembling the same, the probe card has a base plate, a plurality of probes, a fixing ring, and a fixing member. The fixing ring is provided with a hole and the outer wall of its bottom is used for connecting the probes. The fixing ring is spaced from the probes in a distance so that when the fixing ring is inserted through a hole of the base plate, the terminal ends of main bodies of the probes are located under the hole while the anterior ends are electronically connected with the base plate or outer circuit. The fixing member is inserted through the hole of the fixing ring, the terminal end of which protrudes out of the hole so that a micro strip line is formed between the terminal end of the fixing member and the terminal ends of the probes.

7 Claims, 5 Drawing Sheets

PROBE CARD AND METHOD FOR ASSEMBLING THE SAME

BACKGROUND OF THE INVENTION

1. Field of the Invention

The present invention relates to a probe card and a method for assembling the same and, more particularly, to a probe card for forming a micro strip line between a fixing member and terminal ends of probes via a fixing ring and the fixing member. The probe card has simple structure, low cost, and is suitable for measuring high frequency signals.

2. Description of the Prior Art

In semiconductor-manufacturing factories, when all manufacturing processes are finished, wafers generally need to take wafer testing (WAT) to check whether the electronic connection from the wafers is normal. A probe card is usually used as a measurement medium to ensure the manufacturing quality when executing the wafer test for wafers. Only are the qualified wafers sent to continue the steps of package and other final tests.

As shown in FIG. 5, the conventional probe card 9 is a printing circuit board "A" and has many probe pins "C" electronically connected with the circuit respectively. The probe card is provided with a central aperture "B", and the plural probes "C" are connected to the peripheries of the bottom of the probe card and extending downwardly form the peripheries toward the central aperture "B" of the probe card in an inclined direction. The terminal end of each probe "C" is located under the central aperture "B" and the point of each probe and its corresponding circuit form a channel. When the wafer testing is to be executed, whether the electronic characteristics of wafers are normal can be checked only by contacting all points of the probe card to specific points on wafers and inputting measurement signals. When the measured signal frequency is getting higher and velocity is increased, the problem of impedance matching should be considered. However, known manufacturing methods for manufacturing probe cards fail to meet this need.

Recently, a high frequency probe card is designed to utilize coaxial cables to replace traditional probe cards on measurement. However, because of the large size of the coaxial cables, the probe cards using coaxial cables are difficult to be designed and manufactured within limited space in a base plate, and it is also inconvenient for operators in adjustment and measurement. Moreover, although membrane probe cards have been invented to substitute the probe cards using coaxial cables for measurement, more steps are needed in manufacturing membrane probe cards, which will elevate the cost.

SUMMARY OF THE INVENTION

An object of the present invention is to provide a probe card and a method for assembling the same, wherein a micro strip line is formed between the terminal end of a fixing member and the terminal ends of probes via a fixing ring and the fixing member.

In order to achieve the above object, the probe card according to the present invention comprises a base, a plurality of probes, a fixing ring, and a fixing member. The fixing ring is provided with a hole. The outer wall of the fixing ring's bottom is connected with the probes and the fixing ring is spaced from the probes in a certain distance, so that when the fixing ring is inserted through a hole of the base plate, the terminal ends of main bodies of the probes are located under the hole while the anterior ends are in electronic connection with the base plate or outer circuit. The fixing member is connected to the hole of the fixing ring and its terminal end protrudes out of the hole, so that a micro strip line is formed between the terminal end of the fixing member and the terminal ends of the probes.

The following detailed description, given by way of examples and not intended to limit the invention solely to the embodiments described herein, will best be understood in conjunction with the accompanying drawings.

DETAILED DESCRIPTION OF THE PREFERRED EMBODIMENTS

Figure 1:
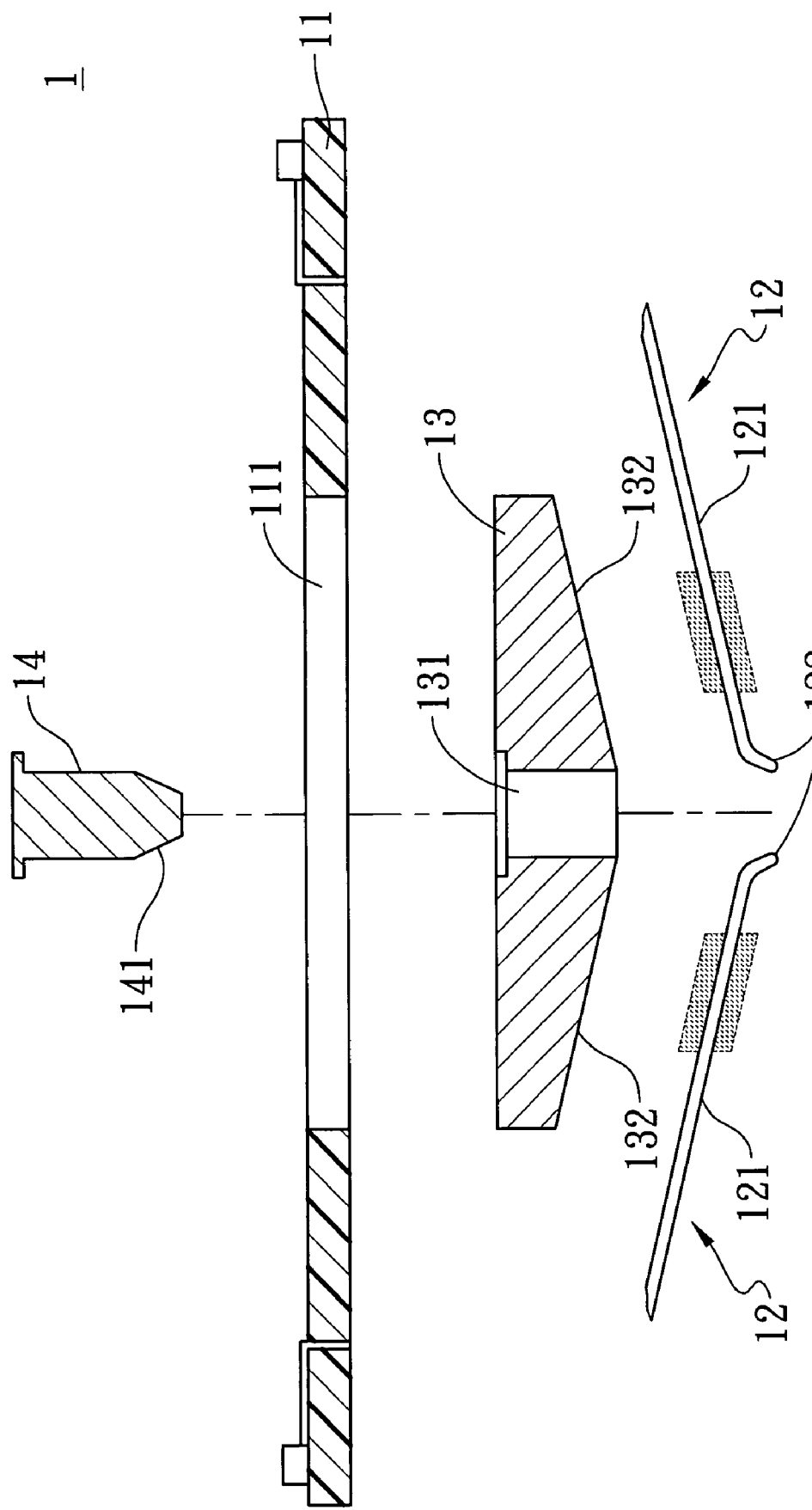
FIG. 1 is an exploded and sectional view of a probe card of the present invention.
Figure 2:
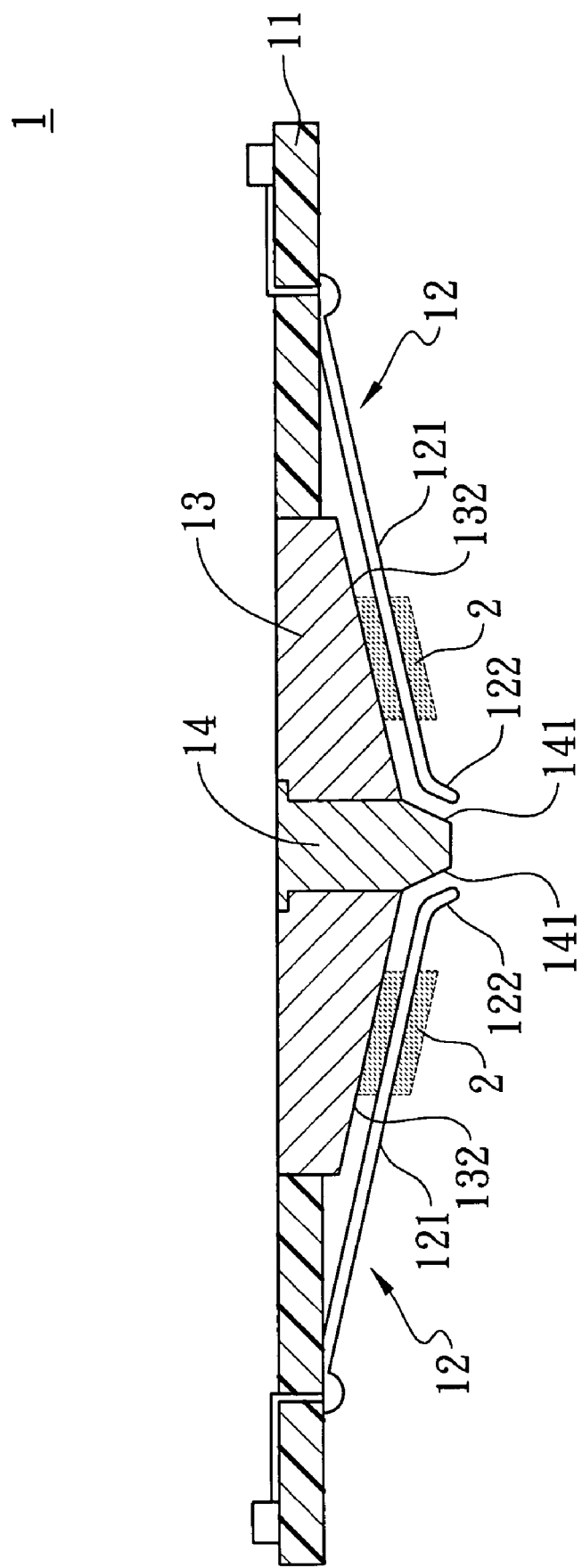
FIG. 2 is a sectional view of the probe card of the present invention.

Please refer to FIGS. 1-2, which show one embodiment of a probe card 1 according to the present invention. The probe card 1 comprises a base plate 11 having electronic circuit, a plurality of probes 12, a fixing ring 13, and a fixing member 14. The base plate 11 is provided with a hole 111 and each probe 12 has a main body 121.

The fixing ring 13 is provided with a hole 131 centrally and on its bottom has an outer wall 132 sloping downwardly for connecting the plurality of probes 12 thereon. The bottom of the fixing ring 13 is spaced from the probes 12 connected thereto in a certain distance. Besides, a micro strip line is formed between the outer wall 132 and the main body 121 from the anterior end to the terminal end of each probe 12. The fixing ring 13 is inserted through the hole 111 of the base plate 11. The terminal ends 122 of the main bodies 121 of the probes 12 are located under the hole 111 while the anterior ends of the main bodies 121 of the probes 12 are in electronic connection with the base plate 11 or outer circuit. Moreover, the main bodies 121 of the plural probes 12 surround and are connected to the outer wall 132 of the fixing ring 13 in a downwardly sloping direction, and the terminal end 122 of each probe 12 is bent in an angle for measurement.

In the first embodiment, the fixing member 14 is screwed into the hole 131 and the terminal end 141 of the fixing member 14 protrudes out of the hole 131, so that a micro strip line is formed between the terminal end 141 of the fixing member 14 and the terminal end 122 of each probe 12.

Figure 3:
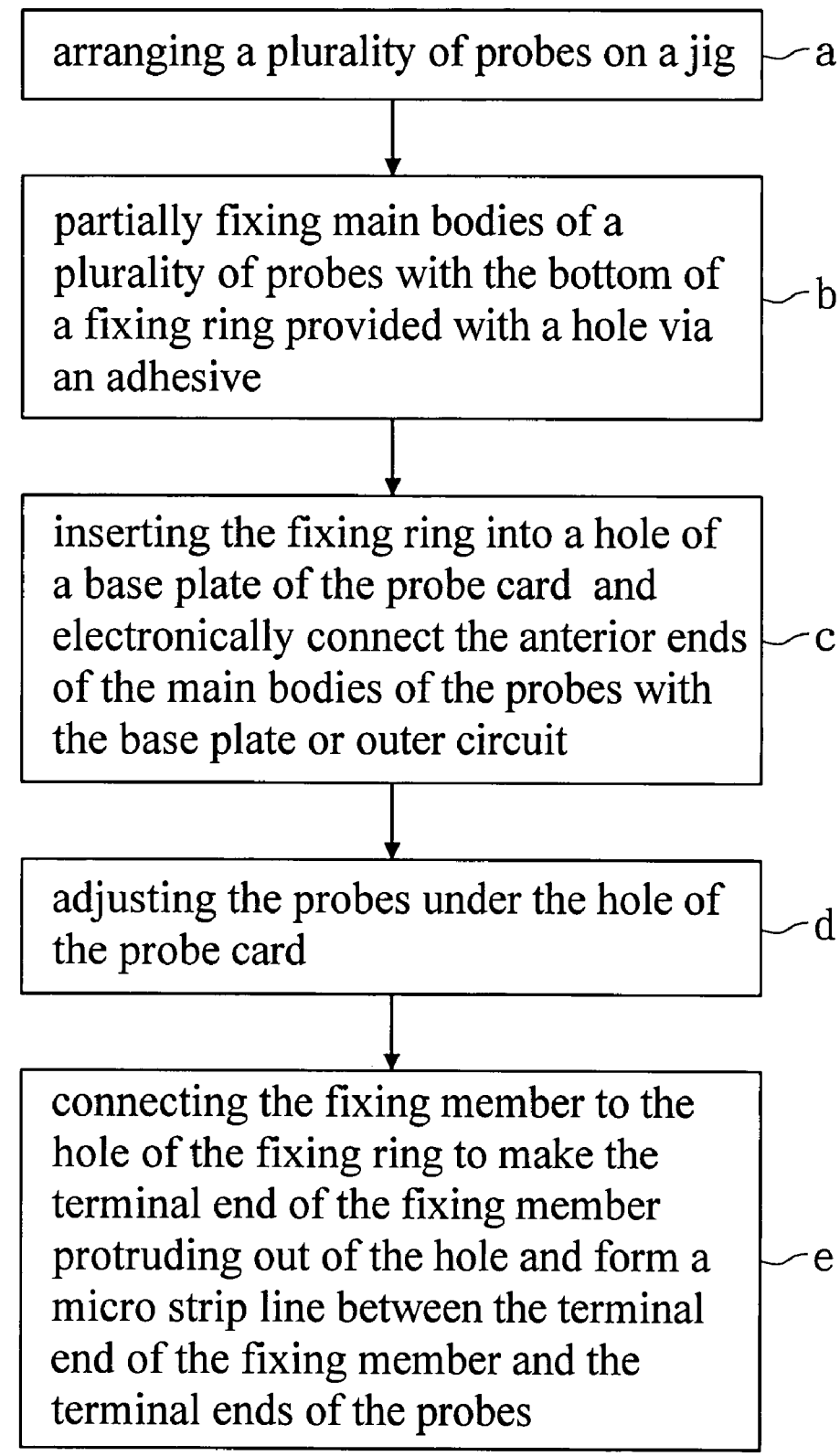
FIG. 3 is a flow chart of a method for assembling the probe card of the present invention.

Please refer to FIGS. 1-3. In implementing the invention, arrange a plurality of probes 12 on a jig first, then partially fix the main bodies 121 of a plurality of probes 12 with the bottom of the fixing ring 13 via an adhesive, insert the fixing ring 13 into the hole 111 of the base plate 11 of the probe card 1 and electronically connect the anterior ends of the main bodies 121 of the probes 12 with the base plate 11 or outer circuit, and adjust the terminal ends 122 under the hole 111 for in contact with a corresponding bond pad on a wafer.

Thereafter, insert the fixing ring 13 provided with the hole 131 through the hole 111 of the base plate 11 of the probe card 1. After adjusting the probes 12 under the hole 111 of the probe card 1 by means of the hole 131, insert the fixing member 14 into the hole 131 of the fixing ring 13 to make the terminal end 141 of the fixing member 14 protrude out of the hole 131 and form a micro strip line between the terminal end 141 of the fixing member 14 and the terminal end 122 of each probe 12.

Therefore, the method for assembling the probe card 1 according to the present invention mainly comprises steps of:
- a. arranging a plurality of probes on a jig;
- b. partially fixing main bodies of a plurality of probes with the bottom of a fixing ring via an adhesive;
- c. inserting the fixing ring into the hole of the base plate of the probe card and electronically connect the anterior ends of the main bodies of the probes with the base plate or outer circuit;
- d. adjusting the probes under the hole of the probe card;
- e. connecting the fixing member to the hole of the fixing ring to make the terminal end of the fixing member protrude out of the hole and form a micro strip line between the terminal end of the fixing member and the terminal ends of the probes.

Figure 4:
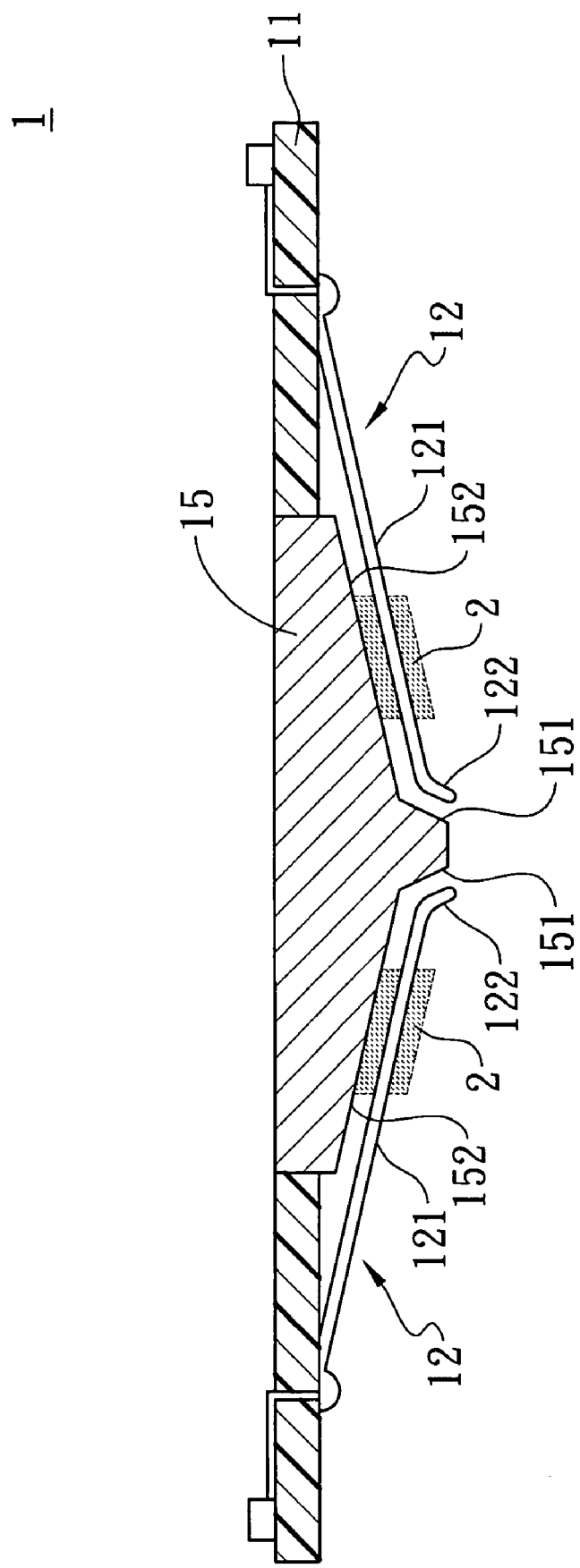
FIG. 4 is a sectional view showing a fixing seat formed by a fixing ring and a fixing member in the probe card of the present invention.
Figure 5:
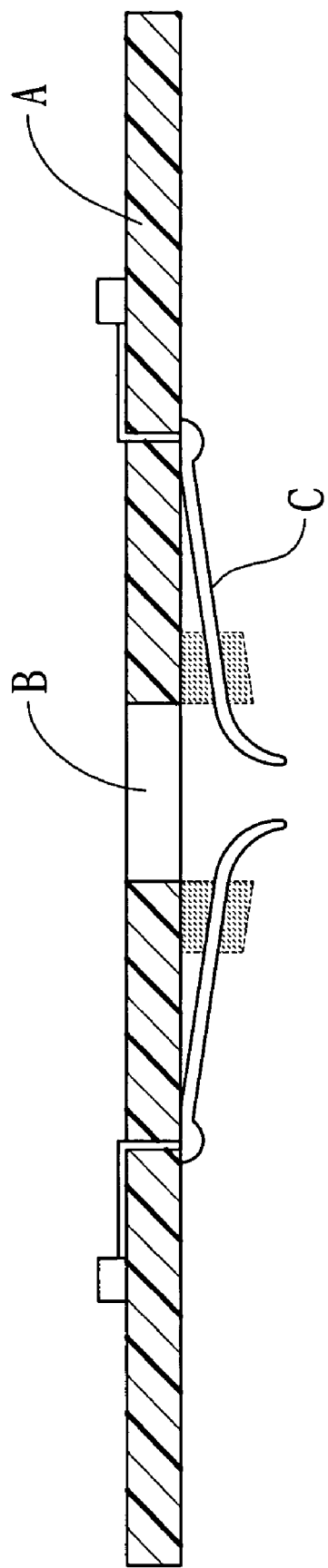
FIG. 5 is a sectional view of a conventional probe card.

Moreover, as shown in FIG. 4, the fixing member 14 can be formed directly within the hole 131 of the fixing ring 13 to render the fixing member 14 and the fixing ring 13 to form a fixing seat 15, so that the micro strip line in the form of a gap can be formed between the terminal end 151 of the bottom of the fixing seat 15 and each of the terminal ends 122 of the probes 12. The bottom of the fixing seat 15 is provided with an outer wall 152 sloping downwardly and a micro strip line is formed between the outer wall 152 and the main bodies 121 from the anterior ends to the terminal ends of the probes 12.

Thereby, the present invention has the following advantages:
1. The present invention is provided with a fixing member whose terminal end protrudes out of the hole after the fixing member is connected to the hole of the fixing ring, so that a micro strip line is formed between the terminal end of the fixing member and the terminal ends of the probes. A micro strip line is simultaneously formed between the bottom of the fixing ring and the main bodies from the anterior ends to the terminal ends of the probes. Thus, the purpose and the effect of measuring high frequency signals can be achieved and elevated.
2. By the disposition of the fixing member and the fixing ring, the present invention is advantageous in several aspects including that the purpose of measuring high frequency signals can be achieved, the structure is simple, and the manufacturing cost is low.
3. According to the present invention, the fixing member can be directly formed within the hole of the fixing ring to make the fixing member and the fixing ring form the fixing seat, so that a micro strip line is formed between from the bottom to the terminal end of the fixing seat and the correspondingly most parts of the main bodies of the probes and better measurement can be achieved.

Accordingly, as disclosed in the above description and attached drawings, the present invention can provide a probe card and a method for assembling the same. It is new and can be put into industrial use.

It should be understood that different modifications and variations could be made from the disclosures disclosed above by the people familiar in the art, without departing the spirit of the present invention.

What is claimed is:

1. A probe card, comprising:
   a base plate having electronic circuit and provided with a hole;
   a plurality of probes, where each probe is provided with a main body;
   a fixing ring provided with a hole centrally, where the outer wall of its bottom is for connecting the probes thereon, and the fixing ring is spaced from the probes in a certain distance, so that when the fixing ring is inserted through the hole of the base plate, the anterior ends of main bodies of the probes are in electronic connection with the base plate or an outer circuit while the terminal ends of main bodies of the probes are located under the hole of the fixing ring; and
   a fixing member connected to the hole of the fixing ring, where the terminal end of the fixing member protrudes out of the hole of the fixing ring, so that a micro strip line is formed as gaps separating the terminal end of the fixing member and the terminal ends of the probes.

2. The probe card as claimed in claim 1, wherein the bottom of the fixing ring is provided with an outer wall sloping downwardly and the micro strip line is formed as gaps separating the outer wall and the main bodies, the gaps extending from the anterior ends to the terminal ends of the probes.

3. The probe card as claimed in claim 1, wherein the fixing member is screwed into the hole of the fixing ring.

4. The probe card as claimed in claim 1, wherein the fixing member is formed directly within the hole of the fixing ring to render the fixing member and the fixing ring to form a fixing seat, so that the micro strip line is formed as gaps separating the bottom of the fixing seat and the terminal ends of the probes.

5. The probe card as claimed in claim 4, wherein the bottom of the fixing seat is provided with an outer wall sloping downwardly and the micro strip line is formed as gaps separating the outer wall and the main bodies, the gaps extending from the anterior ends to the terminal ends of the probes.

6. A method for assembling a probe card, comprising steps of:
   - a. arranging a plurality of probes on a jig;
   - b. partially fixing main bodies of the plurality of probes with the a bottom of a fixing ring provided with a hole via an adhesive;
   - c. inserting the fixing ring into a hole of a base plate of the probe card and electronically connect the anterior ends of the main bodies of the probes with the base plate or an outer circuit;
   - d. adjusting the probes under the hole of the probe card;
   - e. connecting the a fixing member to the hole of the fixing ring to make the terminal end of the fixing member protruding out of the hole of the fixing ring and form a micro strip line as gaps separating the terminal end of the fixing member and each of the terminal ends of the probes.

7. The method as claimed in claim 6, wherein the fixing member in step e is formed directly within the hole of the fixing ring to render the fixing member and the fixing ring to form a fixing seat, so that the micro strip line is formed as gaps separating the terminal end of the bottom of the fixing seat and the terminal ends of the probes.

* * * * *